US009581676B2

(12) United States Patent
Ku et al.

(10) Patent No.: US 9,581,676 B2
(45) Date of Patent: Feb. 28, 2017

(54) METHOD OF CALIBRATING AND DEBUGGING TESTING SYSTEM

(71) Applicant: MPI CORPORATION, Zhubei (TW)

(72) Inventors: Wei-Cheng Ku, Zhubei (TW); Shao-Wei Lu, Zhubei (TW); Hao Wei, Zhubei (TW); Yu-Tse Wang, Zhubei (TW)

(73) Assignee: MPI CORPORATION, Zhubei ( * ) Notice: Subject to any disclaimer, the term of this patent is extended or adjusted under 35 U.S.C. 154(b) by 205 days.

(21) Appl. No.: 14/553,153

(22) Filed: Nov. 25, 2014

(65) Prior Publication Data

US 2015/0241544 A1 Aug. 27, 2015

(30) Foreign Application Priority Data

Dec. 13, 2013 (TW) .............................. 102146114 A

(51) Int. Cl.
G01R 31/00 (2006.01)
G01R 35/00 (2006.01)
G01R 31/28 (2006.01)

(52) U.S. Cl.
CPC ......... G01R 35/005 (2013.01); G01R 31/2808 (2013.01); G01R 31/2894 (2013.01)

(58) Field of Classification Search
CPC . G01R 31/26; G01R 31/2642; G01R 31/2648; G01R 31/2831; G01R 31/31702; G01R 1/0491; G01R 31/265; G01R 31/3012; G01R 31/318511; G01R 33/0047; H01L 2933/0033; H01L 33/48
See application file for complete search history.

(56) References Cited

U.S. PATENT DOCUMENTS

| 7,368,925 B2 * | 5/2008 | Navratil ............ G01R 31/2831 324/750.27 |
| 2007/0040565 A1 * | 2/2007 | Jayabalan .......... G01R 31/2831 29/593 |
| 2010/0148813 A1 * | 6/2010 | Erickson ............. G01R 31/312 324/754.03 |

FOREIGN PATENT DOCUMENTS

| CN | 101276298 | 10/2008 |
| CN | 102520339 | 6/2012 |
| TW | 201318088 | 5/2013 |

* cited by examiner

Primary Examiner — Tung X Nguyen
(74) Attorney, Agent, or Firm — Lynette Wylie; Apex Juris, pllc.

(57) ABSTRACT

A method of calibrating and debugging a testing system is provided. First, values of different electrical path segments are calibrated, and parameters of the electrical path segments while being calibrated are saved. After calibration, electrical tests can be processed on a DUT. If the testing system malfunctions, the values of the electrical path segments are calibrated again to compare the current parameters to the previously saved parameters. The component which goes wrong can be found out quickly in this way.

9 Claims, 2 Drawing Sheets

US 9,581,676 B2

METHOD OF CALIBRATING AND DEBUGGING TESTING SYSTEM

BACKGROUND OF THE INVENTION

1. Technical Field

The present invention relates generally to a testing system, and more particularly to a method of calibrating and debugging a testing system.

2. Description of Related Art

To ensure the quality of electronic products, manufacturers commonly use a testing system to check electrical connections between each precision electronic component in different stages of the manufacturing process.

In most cases, before doing electrical tests, the probes of a testing system may have to be calibrated by using a calibration plate, which does tests and provides information of compensation (i.e., returning to zero) for the probes. However, such compensation is applied on the whole circuit of the testing system at once, without knowing the actual condition of each component. Once a testing system malfunctions, it has to take down and test every component in the testing system one by one just to find the problematic one. The process is time-consuming, and leads to poor efficiency of maintaining a testing system.

BRIEF SUMMARY OF THE INVENTION

In view of the above, the primary objective of the present invention is to provide a method of calibrating and debugging a testing system, which exactly knows the current condition of each component in the system, and if the testing system malfunctions, the method is able to effectively find out which component goes wrong.

The present invention provides a method of calibrating and debugging a testing system, wherein the testing system includes a test machine, a switching circuit set, and a probe set which are electrically connected sequentially in series; an electrical path from the test machine to the switching circuit set is defined as a first electrical path segment, and an electrical path from the test machine to the probe set is defined as a second electrical path segment. The method of calibrating and debugging the testing system includes the following steps: a) calibrate values of the test machine, and save a parameter of the test machine while being calibrated as a first parameter; b) calibrate values of the first electrical path segment, and save a parameter of the first electrical path segment while being calibrated as a second parameter; c) calibrate values of the second electrical path segment, and save a parameter of the second electrical path segment while being calibrated as a third parameter; d) make the probe set contact a DUT to do an electrical test; e) calibrate the values of the test machine again, and compare a difference between a parameter of the test machine while being currently calibrated and the first parameter to a first allowable value; if the difference is larger than the first allowable value, the test machine is considered malfunctioned; otherwise, go the next step; f) calibrate the values of the first electrical path segment again, and compare a difference between a parameter of the first electrical path segment while being currently calibrated and the second parameter to a second allowable value; if the difference is larger than the second allowable value, the switching circuit set is considered malfunctioned; otherwise, go the next step; and g) calibrate the values of the second electrical path segment again, and compare a difference between a parameter of the second electrical path segment while being currently calibrated and the third parameter to a third allowable value; if the difference is larger than the second allowable value, the probe set is considered malfunctioned; otherwise, the DUT is considered malfunctioned.

With the aforementioned design of the method of calibrating and debugging the testing system, the current condition of each component of the testing system can be exactly known. Furthermore, when the testing system malfunctions, the component which goes wrong can be quickly found out.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
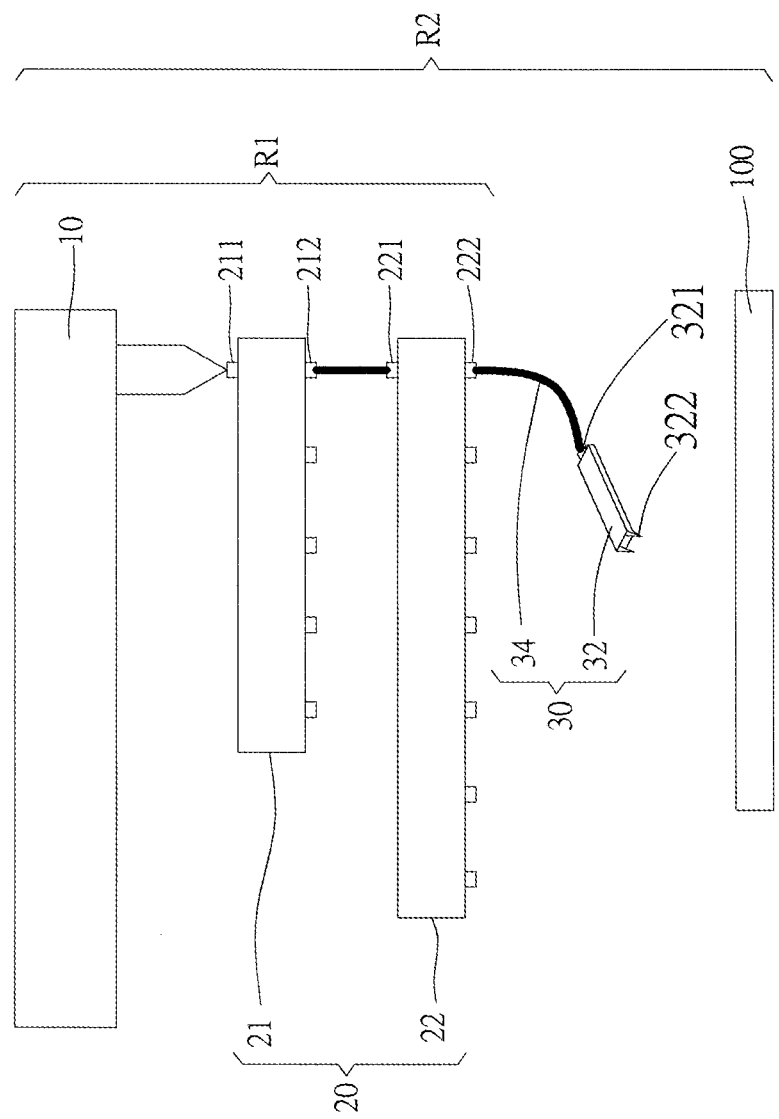
FIG. 1 is a schematic diagram of a testing system suitable for a preferred embodiment of the present invention.

As shown in FIG. 1, a testing system which is suitable for applying a method of calibrating and debugging of the preferred embodiment of the present invention mainly includes a test machine 10, a switching circuit set 20, and a probe set 30 electrically connected sequentially in series.

The test machine 10 generates test signals to do electrical tests, and is capable of determining test results according to signals sent back.

The switching circuit set 20 has a first switching circuit 21 and a second switching circuit 22, which respectively have an input port 211, 221 and a plurality of output ports 212, 222. The switching circuits 21,22 are both controllable to respectively establish electric conductivity between the input port 211 and one of the outputs 212, and between the input port 221 and one of the output ports 222. The input port 211 of the first switching circuit 21 is electrically connected to the test machine 100. The input port 221 of the second switching circuit 22 is electrically connected to one of the output ports 212 of the first switching circuit 21. In addition, the output ports 222 of the second switching circuit 22 are electrically connected to the probe set 30.

The probe set 30 includes a plurality of probes 32 and a plurality of wires 34 which are connected together one to one, wherein the wires 34 are respectively connected to the output ports 222 of the second switching circuit 22. Herein, a pair composed of one of the probes 32 and the connected wire 34 is used for explanation. However, this does not imply any limitation on the numbers of the probes 32 and the wires 34. The probe 32 has a first end 321 and a second end 322, wherein the first end 321 is connected to the wire 34, and is electrically connected to one of the output ports 222 of the second switching circuit 22 through the wire 34, while the second end 322 contacts a device under test (DUT) 100. In addition, an electrical path from the test machine 10 to an end of the switching circuit set 20 is defined as a first electrical path segment R1, and an electrical path from the test machine 10 to an end of the probe set 30 (i.e., the second end 322) is defined as a second electrical path segment R2.

Figure 2:
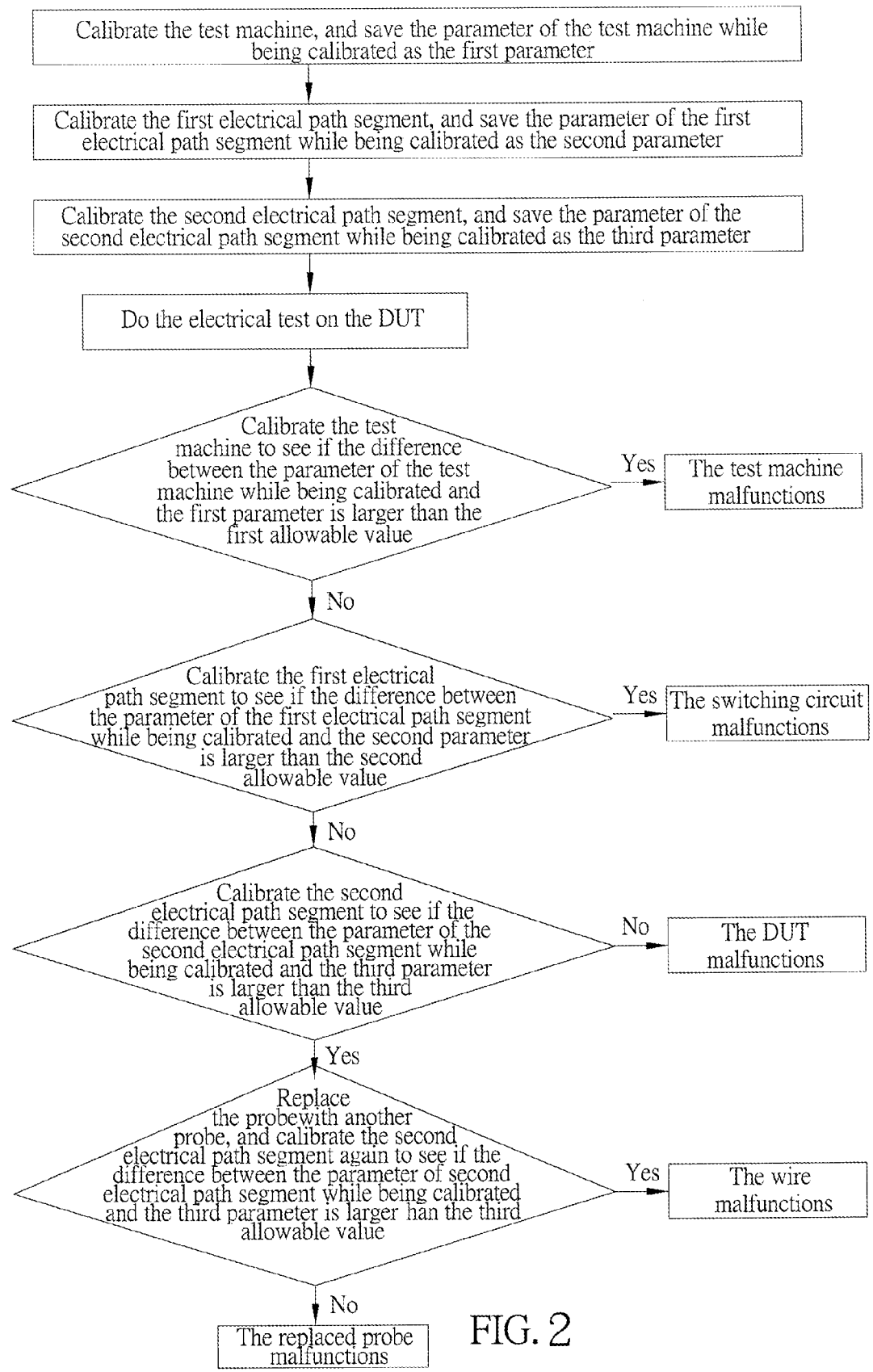
FIG. 2 is a flow chart of the preferred embodiment of the present invention.

As shown in FIG. 2, before the testing system doing an electrical test, the method of calibrating the testing system can be applied first to ensure the accuracy while doing the test, which includes the following steps:

Calibrate values of the test machine 10, and save a parameter of the test machine 10 while being calibrated as a first parameter. In the preferred embodiment, the calibration of values described herein is the compensation on values based on results of short-circuit test, open-circuit test, and impedance test, and the compensated values are saved as the first parameter.

Calibrate values of the first electrical path segment R1, and save a parameter of the first electrical path segment R1 while being calibrated as a second parameter. In the preferred embodiment, the output ports 212 of the first switching circuit 21 which are not connected to the second switching circuit 22 are respectively provided with a short-circuit structure, an open-circuit structure, and an impedance structure. With these structures, the short-circuit test, open-circuit test, and impedance test can be done by controlling the electric conductivity between the input port 211 of first switching circuit 21 and the output ports 212 which are not connected to the second switching circuit 22, which would provide useful results for calibration. In other embodiments, it can only have one or two tests among the short-circuit, open-circuit, and impedance tests to be done, or, these tests can be alternatively done on the output ports 222 of the second switching circuit 22 which are not connected to the probe set 30. In either case, the value of the first electrical path segment R1 can be still calibrated as well.

Calibrate values of the second electrical path segment R2, and save a parameter of the second electrical path segment R2 while being calibrated as a third parameter. In the preferred embodiment, the aforementioned tests for calibration are done on the second end 322 of the probes 32 by making the second end 322 sequentially contact a short-circuit contact point, an open-circuit contact point, and a impedance contact point on a calibration plate (not shown), and the values of the second electrical path segment R2 are calibrated (i.e., returning to zero, compensation on values, etc.) based on the results of the tests.

In this way, once the process of calibration is completed, the probe set 30 is moved to contact the DUT 100 to do the electrical test on the DUT 100. Furthermore, the aforementioned method of calibrating the testing system also provides parameters of the test machine 10, the first electrical path segment R1, and the second electrical path segment R2, which can be uses as a basis to determine the current condition of installation or aging of the test machine 10, the switching circuit set 20, and the probe set 30.

In addition to the aforementioned method of calibrating the testing system, when the testing system malfunctions, a method of debugging the testing system is also provided in the present invention to quickly find out the problematic component. The method of debugging the testing system includes the following steps:

Calibrate the values of the test machine 10 again in the same way described above, and then compare a difference between the first parameter and a parameter of the test machine 10 while being currently calibrated to a first allowable value. If the difference is larger than the first allowable value, it means the test machine 10 malfunctions; otherwise, it might be other parts of the testing system going wrong.

Calibrate the values of the first electrical path segment R1 again in the same way as how the previous calibration for the first electrical path segment R1 does if the test machine 10 is not the cause of malfunction. After that, compare a difference between the second parameter and a parameter of the first electrical path segment R1 while being currently calibrated to a second allowable value. If the difference is larger than the second allowable value, it means the switching circuit set 20 malfunctions; otherwise, it might be other parts of the testing system going wrong.

Calibrate the values of the second electrical path segment R2 again in the same way as how the previous calibration for the second electrical path segment R2 does if neither of the test machine 10 nor the first electrical path segment R1 is the cause of malfunction. After that, compare a difference between the third parameter and a parameter of the second electrical path segment R2 while being currently calibrated to a third allowable value. If the difference is larger than the third allowable value, it means the probe set 30 malfunctions; otherwise, it's the DUT 100 going wrong.

If the probe set 30 malfunctions, the exact malfunctioning component in the probe set 30 can be further pointed out by replacing the probe 32 with another normal probe and calibrating the values of the second electrical path segment R2 again. If a difference between the third parameter and a parameter of the second electrical path segment R2 while being currently calibrated is larger than the third allowable value, it means the wire 34 malfunctions; otherwise, it's the replaced probe 32 malfunctions.

It is worth mentioning, the aforementioned first allowable value, second allowable value, and third allowable value can be values or ratios of differences between the previously saved parameters and the current parameters. Furthermore, the first allowable value, the second allowable value, and the third allowable value can be all equal, or can be different depending on different requirements.

In summary, with the method of calibrating and debugging a testing system provided in the present invention, the current condition of every component can be precisely known, and once if the testing system malfunctions, the problematic component can be quickly found out. The embodiment described above is only a preferred embodiment of the present invention. All equivalent methods which employ the concepts disclosed in this specification and the appended claims should fall within the scope of the present invention.

What is claimed is:

1. A method of calibrating and debugging a testing system, wherein the testing system includes a test machine, a switching circuit set, and a probe set which are electrically connected sequentially in series; an electrical path from the test machine to the switching circuit set is defined as a first electrical path segment, and an electrical path from the test machine to the probe set is defined as a second electrical path segment; comprising the steps of:

(a) calibrating values of the test machine, and saving a parameter of the test machine while being calibrated as a first parameter;

(b) calibrating values of the first electrical path segment, and saving a parameter of the first electrical path segment while being calibrated as a second parameter;

(c) calibrating values of the second electrical path segment, and saving a parameter of the second electrical path segment while being calibrated as a third parameter;

(d) making the probe set contact a DUT to do an electrical test;

(e) calibrating the values of the test machine, and comparing a difference between a parameter of the test machine while being currently calibrated and the first parameter to a first allowable value; if the difference is larger than the first allowable value, the test machine is considered malfunctioned; otherwise, go the next step;

(f) calibrating the values of the first electrical path segment again, and comparing a difference between a parameter of the first electrical path segment while being currently calibrated and the second parameter to a second allowable value; if the difference is larger than the second allowable value, the switching circuit set is considered malfunctioned; otherwise, go the next step; and (g) calibrating the values of the second electrical path segment again, and comparing a difference between a parameter of the second electrical path segment while being currently calibrated and the third parameter to a third allowable value; if the difference is larger than the second allowable value, the probe set is considered malfunctioned; otherwise, the DUT is considered malfunctioned.

2. The method of claim 1, wherein the values of the test machine, the first electrical path segment, and the second electrical path segment are calibrated by being compensated according to results of at least one test among a short-circuit test, an open-circuit test, and an impedance test; the compensated values of the test machine, the first electrical path segment, and the second electrical path segment are respectively saved as the first, the second, and the third parameter.

3. The method of claim 1, wherein the switching circuit set has a first switching circuit and a second switching circuit; each of the switching circuits respectively has an input port and a plurality of output ports; the input port of the first switching circuit is electrically connected to the test machine; the input port of the second switching circuit is electrically connected to one of the output ports of the first switching circuit; at least one output port of the second switching circuit is electrically connected to the probe set; the values of the first switching circuit are calibrated according to results of tests done on at least one output port of the first switching circuit which is not connected to the second switching circuit in step (b).

4. The method of claim 3, wherein the values of the first switching circuit are calibrated according to results of tests done on at least one output port of the first switching circuit which is not connected to the second switching circuit in step (f).

5. The method of claim 1, wherein the switching circuit set has a first switching circuit and a second switching circuit; each of the switching circuits respectively has an input port and a plurality of output ports; the input port of the first switching circuit is electrically connected to the test machine; the input port of the second switching circuit is electrically connected to one of the output ports of the first switching circuit; at least one output port of the second switching circuit is electrically connected to the probe set; the values of the first switching circuit are calibrated according to results of tests done on at least one output port of the second switching circuit which is not connected to the probe set in step (b).

6. The method of claim 5, wherein the values of the first switching circuit are calibrated according to results of tests done on at least one output port of the second switching circuit which is not connected to the probe set in step (f).

7. The method of claim 1, wherein the probe set has a first end and a second end; the first end is electrically connected to the switching circuit set; the second end contacts the DUT; the values of the second electrical path segment are calibrated according to results of tests done on the second end in step (c).

8. The method of claim 7, wherein the values of the second electrical path segment are calibrated according to results of tests done on the second end in step (g).

9. The method of claim 1, wherein the probe set has at least one probe and at least one wire; the probe has a first end and a second end, wherein the first end is connected to the wire, and is electrically connected to the switching circuit set through the wire; the second end contacts the DUT; if the difference between the third parameter and the parameter of the second electrical path segment while being calibrated in step (g) is larger than the third allowable value, the probe is replaced with another probe, and the values of the second electrical path segment are calibrated again; if a difference between the third parameter and a parameter of the second electrical path segment while being calibrated this time is larger than the third allowable value, the wire is considered malfunctioned; otherwise, the replaced probe is considered malfunctioned.

* * * * *